US009240775B2

(12) United States Patent  
Eberlein

(10) Patent No.: US 9,240,775 B2  
(45) Date of Patent: Jan. 19, 2016

(54) CIRCUIT ARRANGEMENTS

(71) Applicant: Intel Mobile Communications GmbH, Neubiberg (DE)

(72) Inventor: Matthias Eberlein, Holzkirchen (DE)

(73) Assignee: INTEL DEUTSCHLAND GMBH, Neubiberg (DE)

(*) Notice: Subject to any disclaimer, the term of this patent is extended or adjusted under 35 U.S.C. 154(b) by 375 days.

(21) Appl. No.: 13/795,506

(22) Filed: Mar. 12, 2013

(65) Prior Publication Data

US 2014/0269834 A1   Sep. 18, 2014

(51) Int. Cl.
*H03K 5/24* (2006.01)
*G01K 7/01* (2006.01)

(52) U.S. Cl.
CPC ............... *H03K 5/2418* (2013.01); *G01K 7/01* (2013.01); *H03K 5/2445* (2013.01)

(58) Field of Classification Search
CPC ......... G01K 7/01; G01K 7/16; H03K 5/2445; H03K 5/2436; H03K 5/2409; H03K 5/2418
USPC ................................ 374/178; 330/69; 327/53
See application file for complete search history.

(56) References Cited

U.S. PATENT DOCUMENTS

| 5,063,342 | A | * | 11/1991 | Hughes et al. ............... 323/315 |
| 5,307,007 | A | | 4/1994 | Wu et al. |
| 5,519,354 | A | | 5/1996 | Audy |
| 5,541,539 | A | * | 7/1996 | Schlachter .................... 327/78 |
| 6,198,267 | B1 | * | 3/2001 | Bakker et al. ................ 323/316 |
| 6,882,213 | B2 | * | 4/2005 | Kim ............................... 327/512 |
| 7,176,701 | B2 | | 2/2007 | Wachi et al. |
| 8,210,743 | B2 | | 7/2012 | Hasegawa |
| 2002/0179299 | A1 | * | 12/2002 | Opris et al. .................... 165/254 |
| 2003/0123520 | A1 | * | 7/2003 | Tesi ............................... 374/178 |
| 2005/0104151 | A1 | | 5/2005 | Wachi et al. |
| 2006/0071733 | A1 | * | 4/2006 | Hsu ............................... 331/176 |
| 2008/0063027 | A1 | * | 3/2008 | Galli ............................. 374/178 |

(Continued)

FOREIGN PATENT DOCUMENTS

| CN | 1643354 A | 7/2005 |
| CN | 101655396 A | 2/2010 |

(Continued)

OTHER PUBLICATIONS

Fabio Sebastiano et al., A 1.2V 10μW NPN-Based Temperature Sensor in 65nm CMOS with an Inaccuracy of ±0.2° C. (3σ) from −70° C. to 125° C., Proc. ISSCC, Feb. 2010, pp. 312-314.

(Continued)

*Primary Examiner* — Lisa Caputo  
*Assistant Examiner* — Philip Cotey  
(74) *Attorney, Agent, or Firm* — Viering, Jentschura & Partner

(57) ABSTRACT

A circuit arrangement may include: a first bipolar transistor; a second bipolar transistor; wherein the circuit arrangement is configured to provide a first current flowing through the first bipolar transistor and a second current flowing through the second bipolar transistor; a resistor connected between a first input of the first bipolar transistor and a first input of the second bipolar transistor; a first circuit configured to provide a first current flowing through the resistor to a first input node of the first bipolar transistor, and a second circuit configured to provide a reference current to the first input node of the first bipolar transistor, wherein the first current and the reference current have different temperature dependencies.

9 Claims, 4 Drawing Sheets

(56) References Cited

U.S. PATENT DOCUMENTS

| | | | |
|---|---|---|---|
| 2009/0146725 A1* | 6/2009 | Kimura | 327/512 |
| 2010/0046580 A1* | 2/2010 | Hasegawa | 374/178 |
| 2010/0060341 A1* | 3/2010 | Zegheru | 327/512 |
| 2010/0123510 A1* | 5/2010 | Yoshikawa | 327/512 |
| 2010/0264980 A1* | 10/2010 | Arguello | 327/513 |
| 2011/0116527 A1* | 5/2011 | Griffin et al. | 374/1 |
| 2011/0169551 A1 | 7/2011 | Stanescu et al. | |
| 2012/0133422 A1* | 5/2012 | Pereira Da Silva et al. | 327/512 |

FOREIGN PATENT DOCUMENTS

| | | |
|---|---|---|
| CN | 102169023 A | 8/2011 |
| JP | H06121452 A | 4/1994 |

OTHER PUBLICATIONS

Kamran Souri et al., A CMOS Temperature Sensor with a Voltage-Calibrated Inaccuracy of ±0.15° C. (3σ) From −55 to 125° C., Proc. ISSCC, Feb. 2012, pp. 208-210.

Joseph Shor et al., Ratiometric BJT-Based Thermal Sensor in 32nm and 22nm Technologies, Proc. ISSCC, Feb. 2012, pp. 210-212.

Y. William Li et al., Smart Integrated Temperature Sensor—Mixed-Signal Circuits and Systems in 32-nm and Beyond, Custom Integrated Circuits Conference (CICC), 2011 IEEE, Sep. 19-21, 2011, 8 pages.

Office Action received for the corresponding Chinese patent application No. 201410088990.9, mailed Apr. 15, 2015, 11 pages. (for reference purposes only).

English translation of the Office Action received for the corresponding Chinese patent application No. 201410088990.9, mailed Apr. 15, 2015, 23 pages. (for reference purposes only).

* cited by examiner

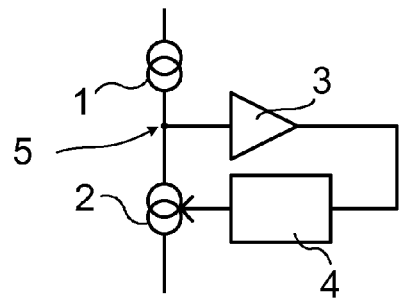
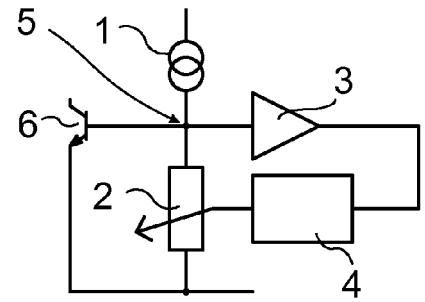
FIG. 1a　　　　　　　　FIG. 1b
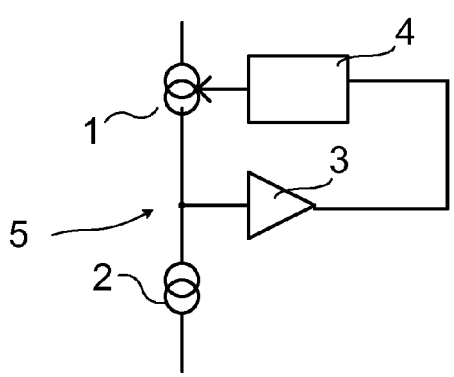
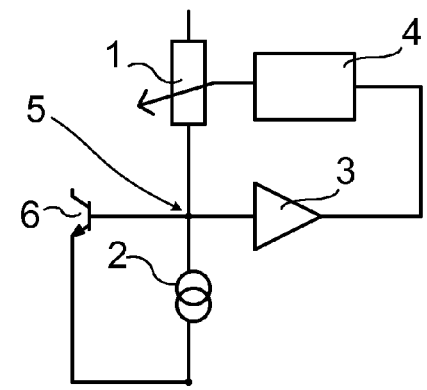
FIG 1c　　　　　　　　FIG 1d
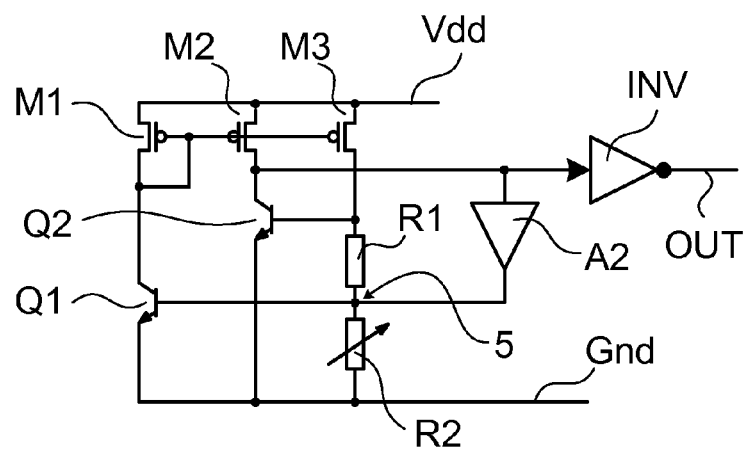
FIG. 2

CIRCUIT ARRANGEMENTS

TECHNICAL FIELD

Various aspects of this disclosure relate generally to circuit arrangements.

BACKGROUND

A conventional approach for a temperature measurement uses a voltage which increases linearly with temperature. This so-called PTAT (proportional-to-absolute-temperature) voltage is typically generated from the difference of two base-emitter voltages of PNP bipolar transistors, which are biased with different current densities (e.g. ratio 1:N).

An actual temperature value can be extracted by comparing the ptat voltage (="dVbe") to a temperature independent reference (e.g. a bandgap). In practice, this is achieved by measuring the ptat voltage (or a multiple of it) directly with an analog-to-digital-converter (ADC), which in turn includes (or is controlled by) such reference.

In general, a temperature measurement with a higher accuracy is desired.

SUMMARY

A circuit arrangement may include: a first bipolar transistor; a second bipolar transistor; wherein the circuit arrangement is configured to provide a first current flowing through the first bipolar transistor and a second current flowing through the second bipolar transistor; a resistor connected between a first input of the first bipolar transistor and a first input of the second bipolar transistor; a first circuit configured to provide a first current flowing through the resistor to a first input node of the first bipolar transistor, and a second circuit configured to provide a reference current to the first input node of the first bipolar transistor, wherein the first current and the reference current have different temperature dependencies.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 1a-1d show basic circuit arrangements suitable for a temperature measurement;

FIGS. 2 to 6 show more detailed circuit arrangements suitable for temperature measurements.

DESCRIPTION

Figure 1E:
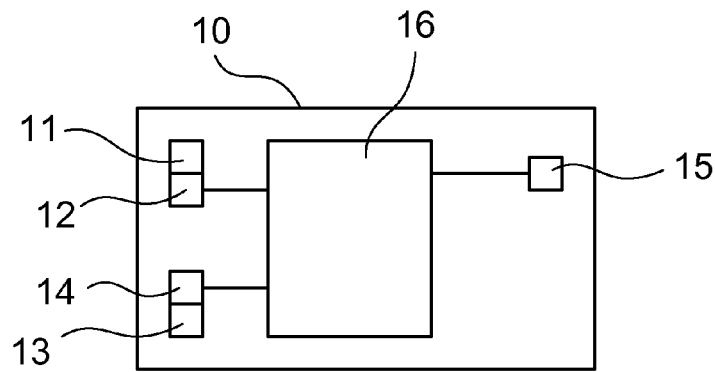
FIG. 1e shows a block diagram of a system where the circuit may be implemented.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

FIG. 1a shows a circuit arrangement in a basic configuration, which may be configured as a thermal sensor. The circuit arrangement includes a first current source 1 configured to provide a first current and a second current source 2 configured to provide a second current, both current source 1, 2 connected to a summing node 5. With respect to the summing node 5 the first current and the second current may have different polarities. This may be accomplished by connecting a series connection of the first current source 1 and the second current 2 to a voltage source. Thus, at the summing node 5, the difference of the first current and the second current is available.

The first current source 1 may be configured to provide the first current dependent on the temperature according a first temperature dependency. The second current source 2 may be configured to provide the second current dependent on the temperature according to a second temperature dependency being different from the first temperature dependency. Thus, the current difference available at the summing node 5 may become dependent on the temperature. A control circuit 4 may further be provided configured to control the second current source 2, e.g. the current provided by the second current source 2. The second current source 2 may furthermore be configured to provide the second current further dependent on a current control signal provided to a control input of the second current source 2. It should be noted that in an alternative, the control circuit 4 may also be configured to control an input of the first current source 1, as shown in FIG. 1c and FIG. 1d, respectively).

The circuit arrangement may further include a current comparator 3 with an input connected to the summing node 5. The current comparator 3 is configured to sense the current difference at summing node 5 and to provide at its output a current difference signal depending on a difference between the first current and the second current. In a variant, the polarity of the current difference may be sensed and the current comparator 3 may indicate which current of the first current or second current has a higher value. For this purpose it may be sufficient for the current comparator 3 to provide a one bit value. However, in various aspects of this disclosure, the current comparator 3 may provide an analog value representing the current difference or a digital value with a range larger than two. Furthermore, the current comparator 3 may have an offset at its input. An offset at the input may be used to compensate for different levels of the first current and the second current. The output of the current comparator is connected to an input of a control circuit 4.

The control circuit 4 is configured to provide at its output the current control signal which is supplied to the second current source 2 in order to control the second current. The current control signal may be generated by the control circuit 4 such that the current difference signal provided by the current comparator 3 adopts a fixed reference value which may be the value zero. The current comparator 3 together with the control circuit 4 may form a control loop which sets the current control value for the second current source 2 such that the first current and the second current have equal values. If the current difference signal is matched to the reference value the current control signal may be provided as an indication of the temperature.

FIG. 1b shows a variant of the circuit arrangement shown in FIG. 1a in which the second current source 2 is formed by a controllable resistor 2 connected in parallel to the pn-junction between the base (as one implementation of a first input) and the emitter of a bipolar transistor 6 in forward direction. The other components of the circuit arrangement of FIG. 1b correspond to the respective components of FIG. 1a and are as described with reference to the circuit arrangement of FIG. 1a if not otherwise stated.

The transistor 6 may be a npn transistor or a pnp transistor. The second current is generated by the resistor 2 across the base emitter voltage of transistor 6. The base emitter voltage is dependent on the temperature and has a negative temperature coefficient. The current control signal provided by the control circuit 4 may control the value of the resistor 2. The current through the resistor 2 (which may also be referred to as second current) thus may be dependent on the temperature with a negative temperature coefficient and the current control signal.

The first current source 1 may be configured to provide a first current dependent on the temperature with a first temperature dependency different from the temperature dependency of the second current source 2. The temperature coefficient of the first current may be positive and the first current might be a current proportional to absolute temperature.

The first current source 1 and the second current source 2 may be connected in series to a supply voltage. At the connection between the two current sources, there is the summing node 5 at which the difference between the first current and the second current is available and which is connected to the current comparator 3 configured to produce a one bit signal as current difference signal indicating whether the current difference present at the summing node 5 is positive or negative. This current difference signal may be fed to a control circuit 4 configured to provide a digital n-bit current control signal to the controllable resistor 2 which is digitally controllable. The resistor 2 may have an input for a digital current control value for this purpose. The control circuit 4 may be a logic circuit configured to provide the current control signal such that the current difference signal is minimized. For this purpose, the control circuit 4 may use all kind of known analog-to-digital conversion techniques using a digital-to-analog converter in a feedback loop. The control circuit 4 may be for example a successive approximation logic. The current control signal produced by the control circuit 4 may be an indication of the temperature.

FIG. 1e shows a system 10 where there circuit arrangement is implemented. The system 10 may be a system on chip or in general any semiconductor circuit using an indication of the temperature. The system 10 may have a system block 16, a first temperature sensor 11, 12, a second temperature sensor 13,14 and a third temperature sensor 15. However, the system 10 may have only one temperature sensor or any other number of temperature sensors. The system block 16 may be of any type and may be for example a communication circuit and may have a digital section. The first temperature sensor 11, 12 may have an analog section 11 and a digital section 12. The second temperature sensor 13, 14 may also have an analog section 13 and a digital section 14. The third temperature sensor 15 may have only an analog section 15. The analog sections 11, 13 and 15 of the first, second and third temperature sensor may have the first current source 1 and the second current source 2 and the current comparator 3 of the circuit arrangement. The digital sections 12, 14 of the first and second temperature sensor may have the control circuit 4. For the third temperature sensor 15 the control circuit 4 may be formed by elements within the system block 16. These elements may be dedicated digital circuit components or a program for performing the required functions. The three temperature sensors 11-15 allow to sense the temperature within the system 10 at three different places. Different temperature sensors may also be used to provide both a temperature reading indicating the absolute temperature and a binary temperature information indicating only whether the temperature exceeds a threshold.

FIG. 2 shows a further circuit arrangement which may be configured as a thermal sensor.

The circuit arrangement may include a first bipolar npn transistor Q1 and a second bipolar npn transistor Q2. The emitters of both bipolar transistors Q1 and Q2 may be connected to ground Gnd. The collector of the first bipolar transistor Q1 may be connected via a first p-channel MOSFET transistor M1 to a positive supply node Vdd. The collector of the second bipolar transistor Q2 may be connected via a second p-channel MOSFET transistor M2 to the positive supply node Vdd. The gate of the first MOSFET transistor M1 is connected to the gate of the second MOSFET transistor M2 and to the drain of the first MOSFET transistor which makes both MOSFET transistors M1 and M2 work as a current mirror mirroring the collector current of the first bipolar transistor Q1 to the second bipolar transistor Q2. The collector currents of both bipolar transistors Q1 and Q2 are therefore provided at a fixed ratio. Both bipolar transistors Q1 and Q2 in a further aspect may be matched in order to have similar characteristics, for example by making them in the same technology or by placing them very close together on the die.

The base nodes (as one implementation of a first input nodes) of the first bipolar transistor Q1 and the second bipolar transistor Q2 may be connected together via a first resistor R1. The base node of the first bipolar transistor Q1 may be connected via a second resistor R2 to ground Gnd. The base node of the second bipolar transistor Q2 together with a first node of the first resistor R1 are connected via a third MOSFET transistor M3 to the positive supply node Vdd the gate of the third MOSFET transistor M3 being connected to the gates of the first and the second MOSFET transistors M1 and M2. The third MOSFET transistor M3 may be an extension to the current mirror formed by the first and the second MOSFET transistor M1 and M2 and may provide a current dependent on the collector current of the first bipolar transistor Q1.

The connection between the first resistor R1 and the second resistor R2 forms a summing node 5 at which a difference between the current through the first resistor R1 and the current through the second resistor R2 is provided.

The first resistor R1 drops the difference between the base emitter voltage of the first bipolar transistor and the base emitter voltage of the second bipolar transistor. The base emitter voltages of both bipolar transistors Q1 and Q2 depend on their temperature and their currents and in particular their collector current densities. Since the collector currents and thus substantially the emitter currents of both bipolar transistors Q1 and Q2 are matched by means of the current mirror formed by the first MOSFET transistor M1 and the second MOSFET transistor M2 the voltage between the base nodes of the first bipolar transistor Q1 and the second bipolar transistor Q2 is dependent on the ratio of their collector current densities. The current through the first resistor R1 being proportional to the voltage between the base nodes of both bipolar transistor Q1 and Q2 may thus become proportional to the absolute temperature of the circuit arrangement. The current density of the first bipolar transistor Q1 may be made lower than that of the second bipolar transistor Q2 making the voltage at the base of the first bipolar transistor Q1 lower than the voltage at the base of the second bipolar transistor Q2 making the current through the first resistor R1 flowing into the summing node 5. The different current densities of both bipolar transistors Q1 and Q2 can be achieved by making the collector currents different at transistors with the same area or by having the same collector currents and making the areas of the transistors different or by a combination of both.

The second resistor R2 drops the base emitter voltage of the second bipolar transistor Q2 which may be dependent on the current and the temperature and exhibits a negative temperature coefficient thus causing a second current flowing through the second resistor R2 from the summing node 5 to ground. The current difference between the first current flowing through the first resistor R1 into the summing node 5 and the second current flowing from the summing node 5 into the second resistor R2 furthermore may control the first bipolar transistor Q1 since its base is connected to the summing node 5. The current difference may be amplified by the first bipolar transistor Q1 and mirrored via the current mirror formed by the three MOSFET transistor M1, M2 and M3 to the current branch containing the first resistor R1 and the second resistor R2. Thus, a feedback loop with a positive feedback may be established. Depending on the comparison result of the first current and the second current at the summing node 5, the system flips between two operating states, therefore providing a bi-stable behavior.

In this circuit arrangement, the different tasks of generating a temperature dependent signal, i.e. the first current, providing a reference, i.e. the second current, and comparison is all accomplished at once within a feedback loop.

The circuit may further include a first amplifier A1 with an input connected to the collector of the second bipolar transistor Q2. The output of the first amplifier A1 may be configured to provide a current and is connected to the summing node 5. The amplifier A1 may be configured to provide a current to the summing node 5 dependent on the voltage at the collector of the second bipolar transistor Q2. The current provided to the summing node 5 may be added to the first current flowing through the first resistor R1. The amplifier A1 illustratively establishes a feedback loop with a negative feedback such that the amplifier A1 tries to compensate the difference between the first current and the second current. The input of the amplifier A1 may be connected to an inverter INV which produces a digital one bit value at its output. The output of the inverter INV may be connected to a control circuit (not shown) which is connected to the second resistor R2 and may be configured to control its value. The control circuit may be configured to adapt the value of the second resistor R2 by means of a current control signal such that the difference between the first current and the second current is minimized. For this purpose, the control circuit may observe the output of the inverter INV. The current control signal generated by the control circuit may then be provided as an indication of the temperature.

Figure 3:
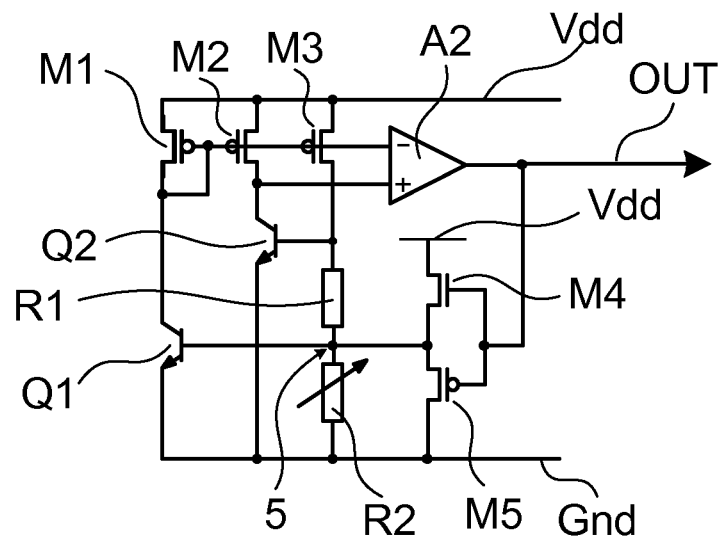

FIG. 3 shows a further circuit arrangement suitable for temperature measurement. The circuit may include like the circuit shown in FIG. 2 a first bipolar transistor Q1 and a second bipolar transistor Q2, three MOSFET transistors M1, M2 and M3 and two resistors R1 and R2. The connection and the function of the aforementioned components is as described with respect to the circuit arrangement shown in FIG. 2. In difference to the circuit arrangement of FIG. 2 the circuit arrangement shown in FIG. 3 may include as an implementation of the amplifier a second amplifier A2 being a differential amplifier which may be an operational amplifier with two inputs connected to the collector nodes of the first bipolar transistor Q1 and the second bipolar transistor Q2. The output of the second amplifier A2 may be connected to a buffer formed by two complementary MOSFET transistors—a fourth MOSFET transistor M4 and a fifth MOSFET transistor M5—and having an output connected to the summing node 5. The gates of both MOSFET transistors M4 and M5 are connected to the output of the amplifier A2. The sources of both MOSFET transistors M4 and M5 are connected together and form the output connected to the summing node 5. The drain of the forth MOSFET transistor M4 which is a n-channel MOSFET transistor is connected to the positive supply voltage Vdd and the drain of the fifth MOSFET transistor M5 which is a p-channel MOSFET transistor is connected to a negative supply voltage or ground Gnd.

The buffer formed by the fourth and the fifth MOSFET transistor M4 and M5 introduces a non-linearity into the transfer curve of the voltage provided to the input of the buffer and the current provided at its output to the summing node 5. The non-linearity has the effect that the ratio between a given output current swing provided by the buffer and the input voltage swing necessary to produce said output current swing is not linear over the input voltage range of the buffer. The buffer may be configured such that this ratio has its minimum at the point where the polarity of the current changes polarity, i.e. around the zero point of the output current larger input voltage swings are necessary to produce a given output current swing than for higher output current values. In one aspect of this disclosure there may be a voltage threshold in the control of the buffer. This means that around the zero point of the output current the input voltage of the buffer corresponding to the output voltage OUT of the amplifier A2 has to overcome this voltage threshold before it can cause a change in the output current. The input voltage of the buffer then is behaving like to a digital signal since all voltages below the threshold voltage do not longer occur since they have no effect on the output current and only higher voltage value above the threshold voltage occur. The output signal OUT of the amplifier A2 may be provided to a digital input for further processing directly or via a comparator, a logic gate or a Schmitt trigger. The buffer formed by the fourth and the fifth MOSFET transistor M4 and M5 may be replaced by a other buffer circuit introducing a strong non-linearity between the output of the amplifier A2 and the current provided at the output of the buffer.

The output voltage of the amplifier A2 is provided to a control circuit (not shown) which provides a current control signal to the second resistor R2. The control circuit may be as described with reference to FIG. 2 and may be configured for example to control the second resistor R2 dependent on the signal OUT provided by the amplifier A2 in such way that the current difference at summing node 5 is minimized. The current control signal required to achieve this may then be used as an indication of the temperature.

Figure 4:
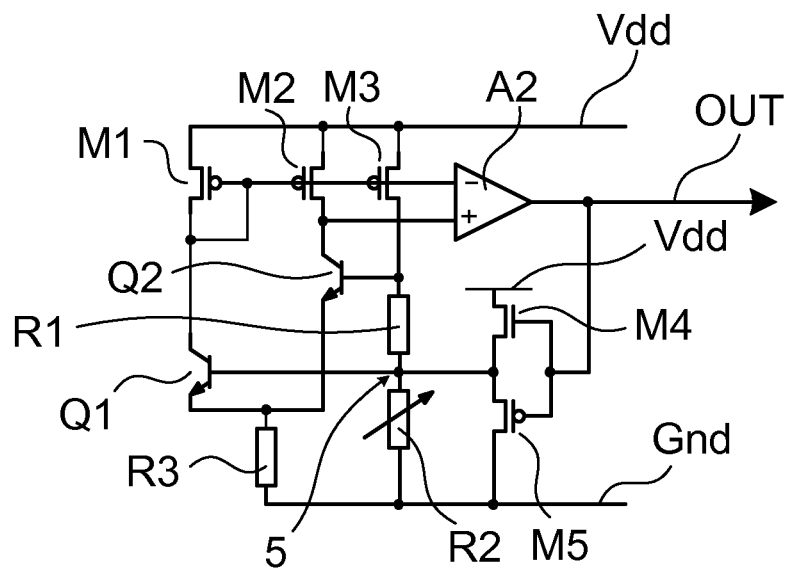

FIG. 4 shows a further aspect of this disclosure. The circuit arrangement corresponds to the circuit arrangement shown in FIG. 3 with the difference that the emitters of the first bipolar transistor Q1 and of the second bipolar transistor Q2 are not connected directly to the negative supply voltage Gnd or ground but via a third resistor R3. The rest of this circuit is as already described with reference to FIG. 3.

Figure 5:
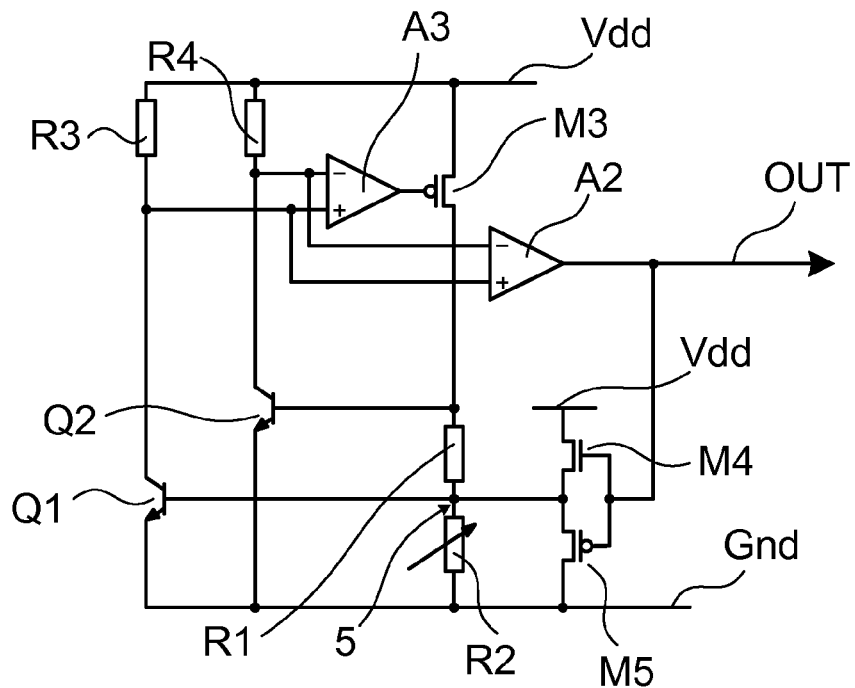

FIG. 5 shows a further aspect of this disclosure. The circuit arrangement of FIG. 5 corresponds to the circuit arrangement shown in FIG. 3 with the difference that a part of the current source formed by the first and second MOSFET transistors M1 and M2 is replaced by a third resistor R3, a fourth resistor R4 and a third amplifier A3 which is a differential amplifier and may be an operational amplifier.

The third resistor R3 is connected between the positive supply voltage Vdd and the collector of the first bipolar transistor Q1 and thus replaces the drain source connection of the first MOSFET transistor M1. The fourth resistor R4 is connected between the positive supply voltage Vdd and the collector of the second bipolar transistor Q2 and thus replaces the drain source connection of the second MOSFET transistor M2. The third amplifier A3 has a positive input connected to the collector of the first bipolar transistor Q1 and a negative input connected to the collector of the second bipolar transistor Q2. The output of the third amplifier A3 is connected to the gate of the third MOSFET transistor M3 which is connected like the third MOSFET transistor M3 in the circuit arrangement of FIG. 3. The third amplifier A3 receives at its differential input the voltage difference between the two collector potential of the first and second bipolar transistors Q1 and Q2.

The other components of the circuit arrangement of FIG. 5 correspond to the respective components of FIG. 3 and are as described with reference to the circuit arrangement of FIG. 3.

Figure 6:
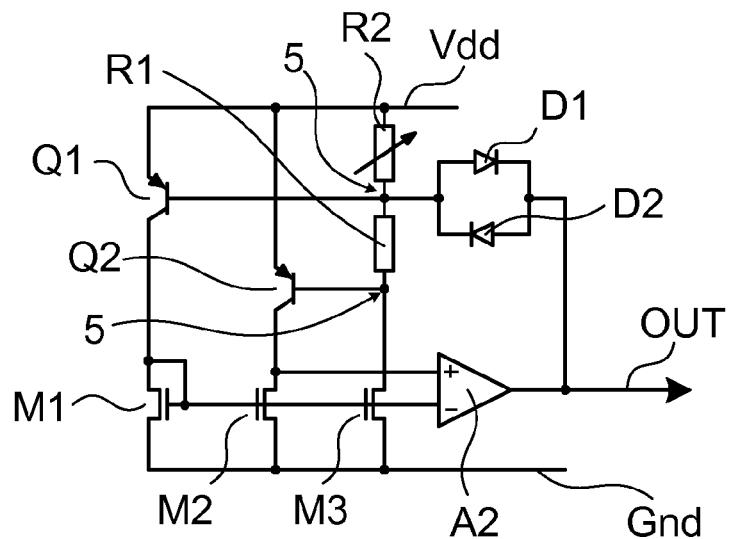

FIG. 6 shows a further aspect of this disclosure. The circuit arrangement of FIG. 6 is basically a complementary variant of the circuit arrangement of FIG. 3. One difference is that both bipolar transistors Q1 and Q2 are pnp type transistors instead of npn type transistors and that the three MOSFET transistors M1, M2 and M3 are n-channel transistors instead of p-channel transistors. The circuit is adapted correspondingly to the other type of the bipolar and MOSFET transistors. Furthermore the element between the output if the second amplifier A2 and the summing node 5 is a diode circuit instead of the MOSFET transistor buffer shown in FIG. 3. The diode circuit has two anti-parallel diodes D1 and D2 connecting the output of the second amplifier A2 to the summing node 5 which means that the output of the second amplifier A2 is connected to the anode of the second diode D2 and the cathode of the first diode D1. The cathode of the second diode D2 and the anode of the first diode D1 are connected to the summing node 5. Due to the fact that a diode for low voltages in forward direction has a non-linear transfer characteristic a minimum voltage across the diodes D1 and D2 is necessary to cause a current flow. The output voltage of the second amplifier A2 shows an increased voltage swing around the operating point at which the polarity of the current provided to the summing point 5 changes and behaves like a digital signal that can be used as input for a subsequent digital circuit. The diode circuit with the first diode D1 and the second diode D2 can be used in all of the other circuit arrangements of FIG. 2 to FIG. 5 and may replace the buffer formed by the fourth MOSFET transistor M4 and the fifth MOSFET transistor M5.

The circuit arrangement of FIG. 6 has furthermore a control circuit (not shown) like the other circuit arrangement of FIG. 3 to FIG. 5 which control the second resistor R2 dependent on the output signal OUT of the second amplifier A2.

Figures 7A, 7B:
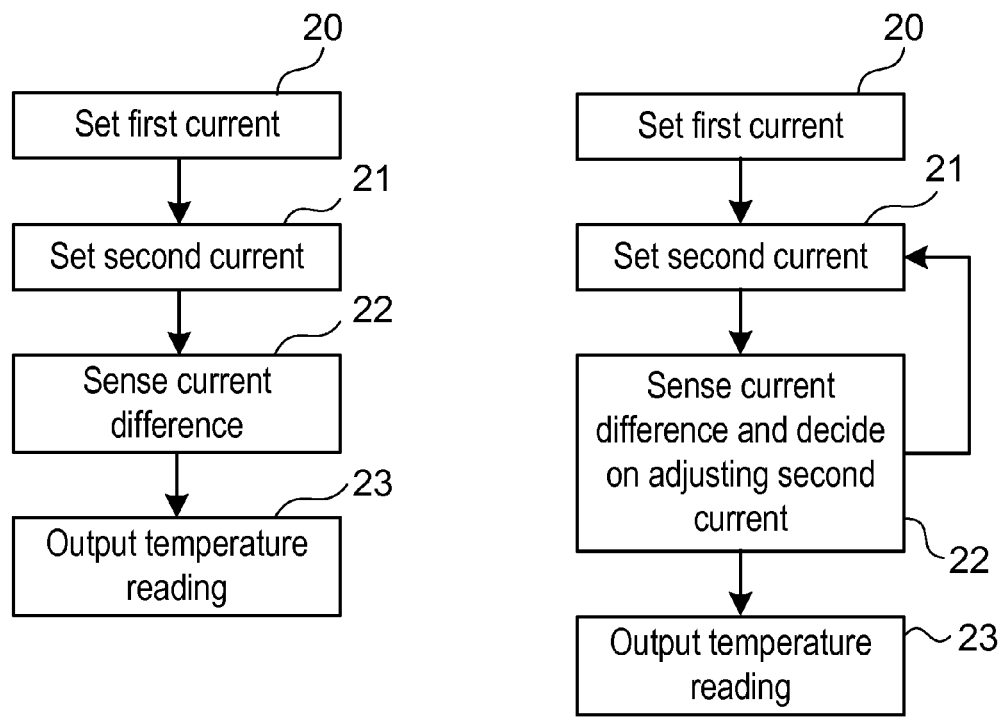
FIGS. 7a and 7b show flowcharts for a method for providing a temperature indication.

FIG. 7a shows a flow chart of a method to provide a temperature indication. First, in 20, the first current may be set. This may be accomplished also by using a current source having a default current setting the current source upon begin of operation providing the first current which is already set according to the default setting. This current source may be non-adjustable. Then, in 21, a second current may be set. Again, this may also be accomplished by using a current source having a default current setting the current source upon begin of operation providing the second current already set according to the default setting. Furthermore, in 23, the difference between the first current and the second current is sensed and a temperature indication may be provided. Since the first current and the second current have different temperature dependencies the sensed difference between the first current and the second current may indicate whether the temperature is above or below a certain threshold.

FIG. 7b shows a further flow chart of a method to provide a temperature indication. In 20, a first current may be set. Like in the flow chart shown in FIG. 7a this may be accomplished by simply using a current source with a default setting. Then, in 21, a second current may be set. After sensing the difference between the first current and the second current, in 22, the method may either continue in 21 and change the setting of the second current or may proceed to 23 and may provide the setting of the second current as temperature indication. The method may use an iterative algorithm of sensing the difference between the two currents and changing the setting of the second current based on the sensed current difference. Such an algorithm may be configured to produce a setting for the second current where the difference between the first current and the second current is as close as possible to a certain value. Depending on the possible settings for the second current it may be that the certain value cannot be fully reached. This certain value might be zero meaning that the first current is as high as the second current. The method may use a successive approximation algorithm. The setting for the second current produced at the end of the method may be used as temperature reading.

In various aspects of this disclosure, a circuit arrangement may include: a first bipolar transistor; a second bipolar transistor; wherein the circuit arrangement is configured to provide a first collector current flowing through the first bipolar transistor and a second collector current flowing through the second bipolar transistor; a resistor connected between the base of the first bipolar transistor and the base of the second bipolar transistor; a first circuit configured to provide a first current flowing through the resistor to a base node of the first bipolar transistor, a second circuit configured to provide a reference current to the base node of the first bipolar transistor, wherein the first current and the reference current have different temperature dependencies.

The first bipolar transistor and the second bipolar transistor may be npn transistors. The first bipolar transistor and the second bipolar transistor may be connected in common emitter configuration. The emitters of the first bipolar transistor and second bipolar transistor may be connected together and via an emitter resistor to a negative supply voltage. The circuit arrangement may further include a first current mirror circuit configured to provide the first collector current and the second collector current at a constant ratio between said collector currents. The first current mirror may be configured to control the second collector current dependent from the first collector current. The circuit arrangement may be configured to provide the first collector current and the second collector current such that the first bipolar transistor and the second bipolar transistor are operated with different current densities. The circuit arrangement may be configured to provide the first collector current and the second collector current such that the current density of the second bipolar transistor is higher than the current density of the first bipolar transistor. Moreover, the first current mirror may be configured to provide a collector current through the second bipolar transistor which is higher than the collector current through the first bipolar transistor. The area of the first bipolar transistor and the area of the second bipolar transistor may be equal. The area of the first bipolar transistor and the area of the second bipolar transistor may be different. The area of the first bipolar transistor may be larger than the area of the second bipolar transistor. The first current mirror may include a first and a second p-channel MOSFET transistor, the first gates of both transistors MOSFET transistors being connected together, to the drain of the first MOSFET transistor and to the collector of the first bipolar transistor, the sources of both MOSFET transistors being connected to a positive supply voltage and the drain of the second MOSFET transistor being connected to the collector of the second bipolar transistor. The circuit arrangement may further include an inner control loop controlling the first current through the resistor dependent on the collector current of the first bipolar transistor or controlling the first current through the resistor dependent on the collector current of the second bipolar transistor. The circuit arrangement may further include an inner control loop configured to increase the first current through the resistor when an increase of the collector current of the first bipolar transistor is detected. Furthermore, the first current mirror circuit may be configured to provide a third current flowing through the resistor at a constant ratio to the collector current of the first bipolar transistor. Moreover, the first current mirror circuit may include a first, a second and a third p-channel MOSFET transistor, the gates of said three MOSFET transistors being connected together, to the drain of the first MOSFET transistor and to the collector of the first bipolar transistor, the sources of said three MOSFET transistors being connected to a positive supply voltage, the drain of the second MOSFET transistor being connected to the collector of the second bipolar transistor and the drain of the third MOSFET transistor being connected to the base node of the second bipolar transistor. The second circuit configured to provide a reference current to the base node of the first bipolar transistor may be controllable. The second circuit is controllable by a digital input. The second circuit may include a digital to analog converter. The circuit arrangement may further include a current comparator configured to provide a current difference signal dependent on the difference between the first current flowing through the resistor and the reference current. The circuit arrangement may further include a control circuit configured to control the second circuit configured to provide the reference current dependent on the current difference signal. The control circuit may be configured to control the reference current such that the difference between the first current flowing through the resistor and the reference current is minimized. The circuit arrangement may further include an amplifier configured to amplify the difference of the first current flowing through the resistor and the reference current and to provide the current difference signal. The amplifier may include the first bipolar transistor. The circuit may further include a third circuit configured to provide a third current to the base node of the first bipolar transistor. The circuit arrangement may further include an outer control loop configured to control the third circuit dependent on the difference between the current flowing through the resistor and the reference current. The circuit arrangement may further include an outer control loop configured to control the third circuit dependent on a voltage at the collector of the first or the second bipolar transistor. The third circuit configured to provide the third current may include a non-linear element. The non-linear element may include an output providing the third current and an input and wherein the voltage swing at the input required to produce a specific current swing at the output has a maximum where the polarity of the third current at the output of the non-linear element changes. The non-linear element may include two anti-parallel diodes. The non-linear element may include a non-inverting push-pull amplifier. The non-linear element may include a buffer including a n-channel and a p-channel MOSFET transistor, the gates of said MOSFET transistors being connecting together and receiving an input voltage, the source of the n-Channel transistor connected to the source of the p-channel transistor and providing the third current, the drain of the n-channel transistor connected to a positive supply voltage and the drain of the p-channel transistor connected to a negative supply voltage.

In various aspects of this disclosure, a temperature sensing circuit arrangement may include: a first current source configured to provide a first current dependent on the temperature of the circuit arrangement; a second current source configured to provide a second current dependent on the temperature of the circuit arrangement and on a current control signal; a summing node connected to the first current source and the second current source configured to receive the first current and the second current; a current comparator connected to the summing node and configured to provide an output signal dependent on the difference between the first current and the second current; a control circuit configured to receive the output signal of the current comparator and to provide the current control signal for controlling the second current source; wherein the temperature dependency of the first current source is different from the temperature dependency of the second current source.

The temperature dependency of the first current source may have a different polarity than the temperature dependency of the second current source. The current comparator may be configured to provide a digital output signal. The control circuit may be configured to provide the current control signal to establish a constant difference between the first current and the second current. Furthermore, the control circuit may be configured to provide the current control signal to minimize the difference between the first current and the second current. Moreover, the current control signal may be a digital value. The current control signal may be an output value indicating the temperature. The circuit arrangement may include a digital control loop configured to receive an output from the current comparator and to provide a digital current control value to the second current source and an analog control loop configured to receive an output of the current comparator and to provide an analog current signal to the summing node. The circuit arrangement may further include a third current source configured to provide a third current to the summing node, the third current source being controlled by the current comparator. The third current source may have a non-linear transfer characteristic between an input signal of the third current source provided by the current comparator and the third current provided at the output of the third current source. The circuit arrangement may be configured to provide the input signal of the third current source as digital input signal to the control signal. The third current source may include two anti-parallel diodes. The third current source may include a buffer comprising two complementary MOSFET transistors in push-pull configuration. The third current source may be configured such that a voltage swing at the input of the third current source required to produce a given current swing at the output of the third current source has a maximum where the polarity of the third current at the output changes. The second current source may include a controllable resistor. The circuit arrangement may further include a current amplifier with an input connected to the summing node and an output connected to the input of the current comparator. The circuit arrangement may further include a first bipolar transistor with a gate connected to the summing node and being part of the current amplifier. Furthermore, the current amplifier may further include a current mirror configured to mirror the collector current of the first bipolar transistor, the input of the current comparator being connected to an output of the current mirror. The circuit arrangement may further include a first and a second bipolar transistor operated at different current densities and being part of the first current source, and may further include a circuit configured to provide the first current proportional to the difference between the base emitter voltage of the first bipolar transistor and the base emitter voltage of the second bipolar transistor. Moreover, the circuit arrangement may further include a second bipolar transistor being part of the second current source, and a circuit configured to provide the second current proportional to the base emitter voltage of the second bipolar transistor. The circuit arrangement may further include a first and a second bipolar transistor operated at different current densities and being part of the first current source, and may further include a circuit configured to provide the first current proportional to the difference between the base emitter voltage of the first bipolar transistor and the base emitter voltage of the second bipolar transistor, the gate of the first bipolar transistor being connected to the summing node, the first bipolar transistor being configured to amplify the difference between the first current and the second current and to generate an amplified current difference signal being provided to the current comparator, the second bipolar transistor being part of the second current source and being connected to a circuit configured to produce the second current proportional to the base emitter voltage of the second bipolar transistor. The circuit arrangement may further include a current mirror configured to provide a collector current to the first bipolar transistor at a constant ratio to a collector current to the second bipolar transistor. The current mirror may be configured to provide the first current at a constant ration to the collector current of the first bipolar transistor. The current mirror may have three current paths. The current comparator may be configured to sense the collector voltage of the first bipolar transistor and the collector voltage of the second bipolar transistor.

In various aspects of this disclosure, a method for sensing the temperature of a circuit arrangement is provided. The method may include: generating a first current dependent on the temperature of the circuit arrangement; generating a second current dependent on the temperature of the circuit arrangement and on a current control signal; generating a current difference signal indicating the difference between the first current and the second current; generating a current control signal based on the current difference signal; wherein the temperature dependency of the first current is different than the temperature dependency of the second current.

The current control signal may be generated such that the current difference signal is minimized. Furthermore, current control signal may be a digital value.

A circuit arrangement may include: an amplifier; and a buffer coupled to an output of the amplifier, the buffer formed by an n-channel metal oxide semiconductor field effect transistor and a p-channel metal oxide semiconductor field effect transistor; wherein the gate terminal of the n-channel metal oxide semiconductor field effect transistor and the gate terminal of the p-channel metal oxide semiconductor field effect transistor are coupled to the output of the amplifier; wherein a drain terminal of the n-channel metal oxide semiconductor field effect transistor is coupled to a first reference potential and a drain terminal of the p-channel metal oxide semiconductor field effect transistor is coupled to a second reference potential different from the first reference potential; wherein a source terminal of the n-channel metal oxide semiconductor field effect transistor is coupled to a source terminal of the p-channel metal oxide semiconductor field effect transistor to form a control output of the circuit arrangement.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
a first bipolar transistor;
a second bipolar transistor;
wherein the circuit arrangement is configured to provide a first current flowing through the first bipolar transistor and a second current flowing through the second bipolar transistor;
a resistor electrically coupled between a first input of the first bipolar transistor and a first input of the second bipolar transistor;
a first circuit configured to provide a first current flowing through the resistor to a first input node of the first bipolar transistor,
a second circuit configured to provide a reference current to the first input node of the first bipolar transistor, wherein the first current and the reference current comprise different temperature dependencies.

2. The circuit arrangement of claim 1,
wherein the first and the second bipolar transistor are npn transistors.

3. The circuit arrangement of claim 1,
wherein the emitters of the first and the second bipolar transistor are electrically coupled to a common node.

4. The circuit arrangement of claim 1, further comprising:
a first current mirror circuit configured to provide the first collector current and the second collector current at a constant ratio between said collector currents.

5. The circuit arrangement of claim 1, further comprising:
an inner control loop controlling the first current through the resistor depending on the collector current of the first bipolar transistor or controlling the first current through the resistor depending on the collector current of the second bipolar transistor.

6. The circuit arrangement of claim 1, further comprising:
a current comparator configured to provide a current difference signal depending on a difference between the first current flowing through the resistor and the reference current.

7. The circuit arrangement of claim 6, further comprising:
a control circuit configured to control the second circuit, wherein the second circuit is configured to provide the reference current depending on the current difference signal.

8. The circuit arrangement of claim 1, further comprising:
a third circuit configured to provide a third current to the base node of the first bipolar transistor.

9. The circuit arrangement of claim 8, wherein the third circuit configured to provide the third current comprises a non-linear element.

* * * * *